US011199778B2

(12) United States Patent
Guo et al.

(10) Patent No.: US 11,199,778 B2
(45) Date of Patent: Dec. 14, 2021

(54) POLYMER BRUSH ADHESION PROMOTER WITH UV CLEAVABLE LINKER

(71) Applicant: INTERNATIONAL BUSINESS MACHINES CORPORATION, Armonk, NY (US)

(72) Inventors: Jing Guo, Niskayuna, NY (US); Bharat Kumar, Tarrytown, NY (US); Ekmini A. De Silva, Slingerlands, NY (US); Jennifer Church, Troy, NY (US); Dario Goldfarb, Dobbs Ferry, NY (US); Nelson Felix, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 241 days.

(21) Appl. No.: 16/299,645

(22) Filed: Mar. 12, 2019

(65) Prior Publication Data

US 2020/0292942 A1   Sep. 17, 2020

(51) Int. Cl.
*G03F 7/20* (2006.01)
*G03F 7/32* (2006.01)

(52) U.S. Cl.
CPC ............ *G03F 7/2004* (2013.01); *G03F 7/322* (2013.01); *G03F 7/325* (2013.01)

(58) Field of Classification Search
None
See application file for complete search history.

(56) References Cited

U.S. PATENT DOCUMENTS

| 7,741,014 B2 | 6/2010 | Ryan et al. |
| 8,129,093 B2 | 3/2012 | Vin et al. |
| 9,293,328 B2 | 3/2016 | Millward |
| 9,362,231 B2 | 6/2016 | Chiang et al. |
| 9,746,774 B2 | 8/2017 | Carcasi et al. |
| 10,031,138 B2 | 7/2018 | Jiang et al. |
| 2012/0028434 A1* | 2/2012 | Lee ............... H01L 21/0206 438/400 |
| 2013/0126472 A1 | 5/2013 | Suzuki |
| 2016/0342087 A1* | 11/2016 | Cheng ............ G03F 7/0045 |
| 2017/0108778 A1* | 4/2017 | Black ............ G03F 7/038 |

(Continued)

FOREIGN PATENT DOCUMENTS

WO    201778628 A1    5/2017

OTHER PUBLICATIONS

Cao et al., "Stimuli-Responsive Polymers and their Potential Applications in Oil-Gas Industry", Polymer Reviews. vol. 55. Issue 4. Oct. 2, 2015. pp. 706-733.

(Continued)

*Primary Examiner* — Kathleen Duda
(74) *Attorney, Agent, or Firm* — Tutunjian & Bitetto, P.C.; Abdy Raissinia

(57) ABSTRACT

A method of making an adhesion layer of an extreme ultraviolet (EUV) stack is presented. The method includes grafting an ultraviolet (UV) sensitive polymer brush on a hardmask, the polymer brush including a UV cleavable unit, depositing EUV resist over the polymer brush, exposing the EUV resist to remove the EUV resist in exposed areas by applying a developer, and flooding the exposed area with a UV light and a solvent developer to remove exposed portions of the polymer brush.

14 Claims, 5 Drawing Sheets

(56) References Cited

U.S. PATENT DOCUMENTS

2017/0194196 A1\* 7/2017 Brink ................ H01L 21/31133
2017/0217997 A1 8/2017 Ahn et al.

OTHER PUBLICATIONS

Dubner et al., "Reversible Light-Switching of Enzymatic Activity on Orthogonally Functionalized Polymer Brushes", Applied Material & Interfaces. vol. 9. Issue 11. Mar. 8, 2017. pp. 9245-9249.
Koylu et al., "Stimuli-Responsive Surfaces Utilizing Cleavable Polymer Brush Layers", Macromolecules. vol. 42. Issue 22. Oct. 6, 2009. pp. 8655-8660.
Ryan et al., "Patterning Multiple Aligned Self-Assembled Monolayers Using Light", Langmuir. vol. 20. Issue 21. Oct. 12, 2004. pp. 2080-2088.
Zhao et al., "o-Nitrobenzyl Alcohol Derivatives: Opportunities in Polymer and Material Science", Macromolecules. vol. 43. Issue 4. Jan. 26, 2012. pp. 1723-1736.

\* cited by examiner

POLYMER BRUSH ADHESION PROMOTER WITH UV CLEAVABLE LINKER

BACKGROUND

The present invention relates generally to surface coatings, and more specifically, to a polymer brush or self-assembled monolayer (SAM) adhesion promoter with an ultraviolet (UV) cleavable linker.

The generation of complex patterns in polymer films is traditionally achieved by combining spin-casting and photolithographic techniques. Polymer films patterned by this procedure are widely used for the fabrication of microelectronic devices or as selective barriers to etchants and redox-active probes. While successful, the utility of these patterned polymer films is restricted by their limited stability to solvents and subsequent chemical reaction, and difficulties in their preparation over large areas and complicated topographies. To address these latter challenges, Whitesides and coworkers have introduced the concept of micro contact printing (μCP) for the preparation of patterned self-assembled monolayers (or "SAMs") on both planar and curved surfaces. However, SAMs can present their own challenges.

SUMMARY

In accordance with an embodiment, a method is provided for making an adhesion layer of an extreme ultraviolet (EUV) stack. The method includes grafting an ultraviolet (UV) sensitive polymer brush on a hardmask, the polymer brush including a UV cleavable unit, depositing EUV resist over the polymer brush, exposing the EUV resist to remove the EUV resist in exposed areas by applying a developer, and flooding the exposed area with a UV light and a solvent developer to remove exposed portions of the polymer brush.

In accordance with another embodiment, a method is provided for making an adhesion layer of an extreme ultraviolet (EUV) stack. The method includes grafting a self-assembled monolayer (SAM) on a hardmask, the SAM including an ultraviolet (UV) cleavable unit, depositing EUV resist over the SAM, exposing the EUV resist to remove the EUV resist in exposed areas by applying a developer, and flooding the exposed area with a UV light and a solvent developer to remove exposed portions of the SAM.

In accordance with yet another embodiment, a semiconductor device is provided for making an adhesion layer of an extreme ultraviolet (EUV) stack. The semiconductor device includes an ultraviolet (UV) sensitive polymer brush grafted on a hardmask, the polymer brush including a UV cleavable unit, EUV resist disposed over the polymer brush, an opening in the EUV resist formed by applying a developer, the opening defining an exposed area, and a UV light flooding the exposed area and a solvent developer to remove exposed portions of the polymer brush.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE DRAWINGS

The invention will provide details in the following description of preferred embodiments with reference to the following figures wherein.

Throughout the drawings, same or similar reference numerals represent the same or similar elements.

DETAILED DESCRIPTION

Embodiments in accordance with the present invention provide methods and devices for making a polymer brush or self-assembled monolayer (SAM) including an ultraviolet (UV) cleavable unit close to the binding site near a hardmask of an extreme ultraviolet (EUV) quad stack. The UV cleavable unit can be a UV cleavable moiety or linker in the polymer chain or SAM close to the binding group, where the polymer brush/SAM can act as an adhesion promoter during EUV exposure. Flood exposure is employed to develop the polymer brush or SAM post EUV exposure to reduce scumming without sacrificing adhesion capability. The flood exposure cleaves the bond and liberates major polymer chains/SAM molecules, thus leaving a thin layer that allows for an easy pattern transfer. The flood exposure further enables cleavable linker removal along with the residue or scumming.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Figure 1:
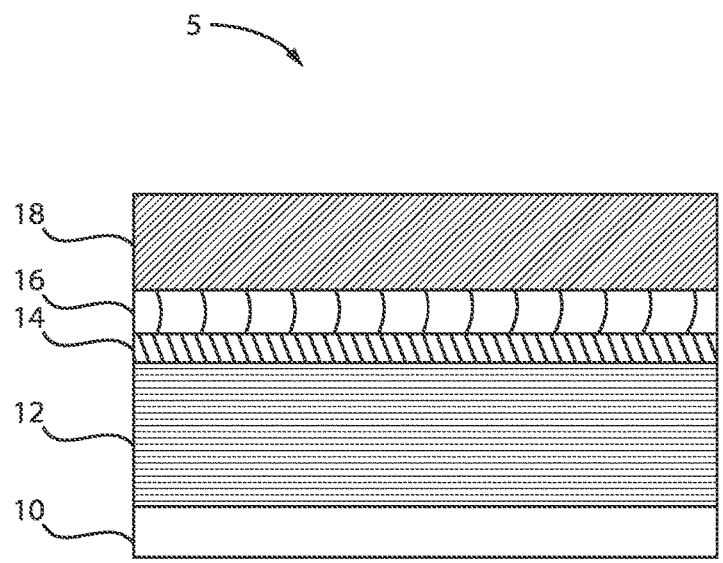
FIG. 1 is a cross-sectional view of an extreme ultraviolet (EUV) stack, in accordance with an embodiment of the present invention.

FIG. 1 is a cross-sectional view of an extreme ultraviolet (EUV) stack, in accordance with an embodiment of the present invention.

A semiconductor structure 5 includes a substrate 10, an organic planarization layer (OPL) 12 formed over the substrate 10, and a hardmask 14 formed over the OPL 12. An adhesion layer 16 can be formed over the hardmask 14. The EUV quad stack needs an adhesion layer 16 for patterning. An EUV resist 18 is then formed over the adhesion layer 16.

EUV lithography uses an EUV light of an extremely short wavelength of 13.5 nm. EUV lithography allows exposure of fine circuit patterns with a half-pitch below 20 nm that cannot be exposed by conventional optical lithography using an argon fluoride (ArF) excimer laser.

The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, GaAs, SiC, or SiGe. The substrate 10 can also have multiple material layers. In some embodiments, the substrate 10 includes a semiconductor material including, but not necessarily limited to, silicon (Si), silicon germanium (SiGe), silicon carbide (SiC), Si:C (carbon doped silicon), silicon germanium carbide (SiGeC), carbon doped silicon germanium (SiGe:C), III-V (e.g., GaAs, AlGaAs, InAs, InP, etc.), II-V compound semiconductor (e.g., ZnSe, ZnTe, ZnCdSe, etc.) or other like semiconductor. In addition, multiple layers of the semiconductor materials can be used as the semiconductor material of the substrate 10. In some embodiments, the substrate 10 includes both semiconductor materials and dielectric materials. The semiconductor substrate 10 can also include an organic semiconductor or a layered semiconductor such as, for example, Si/SiGe, a silicon-on-insulator or a SiGe-on-insulator. A portion or entire semiconductor substrate 10 can be amorphous, polycrystalline, or monocrystalline.

The OPL 12 can be formed at a predetermined thickness to provide reflectivity and topography control during etching of the hard mask layers below. The OPL 12 can include an organic material, such as a polymer. The thickness of the OPL 12 can be in a range from about 50 nm to about 300 nm.

In various embodiments, the hardmask layer 14 can be a nitride, for example, a silicon nitride (SiN), an oxynitride, for example, silicon oxynitride (SiON), or a combination thereof. In a preferred embodiment, the hardmask layer 14 can be silicon nitride (SiN), for example, $Si_3N_4$.

In one or more embodiments, the hardmask layer 14 can have a thickness in the range of about 20 nm to about 100 nm, or in the range of about 35 nm to about 75 nm, or in the range of about 45 nm to about 55 nm, although other thicknesses are contemplated.

One or more of the layers can be formed by various methods, including physical vapor deposition process such as evaporation and DC magnetron sputtering, a plating process such electroless plating or electroplating, a chemical vapor deposition process such as atmospheric pressure CVD (APCVD), low-pressure CVD (LPCVD), plasma enhanced CVD (PECVD) or high-density plasma CVD (HDPCVD), ion beam deposition, spin-on coating, metal organic decomposition (MOD) and/or other suitable methods.

Figure 2:
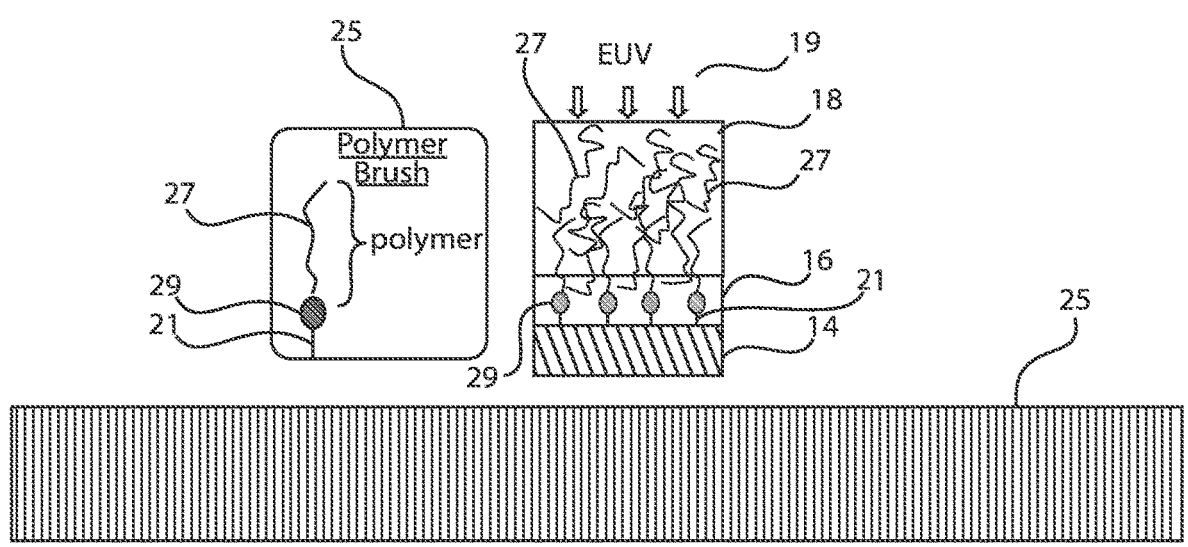
FIG. 2 is a polymer brush as an adhesion promoter.

FIG. 2 is a polymer brush as an adhesion promoter.

The polymer brush 25 includes a polymer 27 and an end group 21 for grafting to hardmask 14. The polymers 27 are positioned within the EUV resist 18, whereas the end groups 21 for grafting are positioned in the adhesion layer 16. A photocleavable bond 29 is installed close to end group 21. UV flood exposure 30 can cleave the bonds 29 and liberate major polymer chains/SAM molecules, as described below with reference to FIGS. 3-4.

A polymer brush is the name given to a surface coating including polymers tethered to a surface. The brush can be either in a solvated state, where the tethered polymer layer includes polymer and solvent, or in a melt state, where the tethered chains completely fill up the space available. These polymer layers can be tethered to flat substrates such as silicon wafers, or highly curved substrates such as nanoparticles.

Stated differently, polymer brushes are generally defined as thin layers of polymer chains end-grafted to a surface. These polymer chains, which are terminally attached to a surface, have a distance between the chains, such that distance "d" is less than twice the radius of gyration of the polymer. Due to chain crowding, the surface tethered macromolecules stretch away from the surface and are in an entropic equilibrium when they exhibit an extended conformation.

Self-assembled monolayers (SAM) of organic molecules are molecular assemblies formed spontaneously on surfaces by adsorption and are organized into more or less large ordered domains. In some cases, molecules that form the monolayer do not interact strongly with the substrate.

A SAM can further be defined as a monomolecular film of a surfactant formed spontaneously on a substrate upon exposure to a surfactant solution. These organic assemblies are formed by the adsorption of molecular constituents having a chemical functionality or head group, with special affinity for a substrate. The main chain, also called tail, forms a highly ordered structure oriented away from the substrate, organized by van der Waals interaction and a terminal group, which determines the surface chemistry. The main driving forces of the formation of these films are the specific interactions between the reactive head group and the surface of the substrate. Based on these interactions, the SAMs are stable films with a remarkable robustness.

"Cleavable linker" is understood as a chemical entity comprising a chemical bonding which upon a specific treatment can be resolved in such a way that the remaining parts of the molecule stay intact. Preferably, the cleavable linker is an "inducible cleavable linker" which is defined as a cleavable linker which can be resolved by means of providing an external stimulus. An example for an inducible cleavable linker is a photo-cleavable linker, wherein the bonding is resolved by means of treatment with light of a defined wavelength.

The cleavable linker molecule can be cleavable by acid, base, light or any other means well known to those trained in the field. Preferably, it is exactly one primer which is bound to the bead via a cleavable linker.

Figure 3:
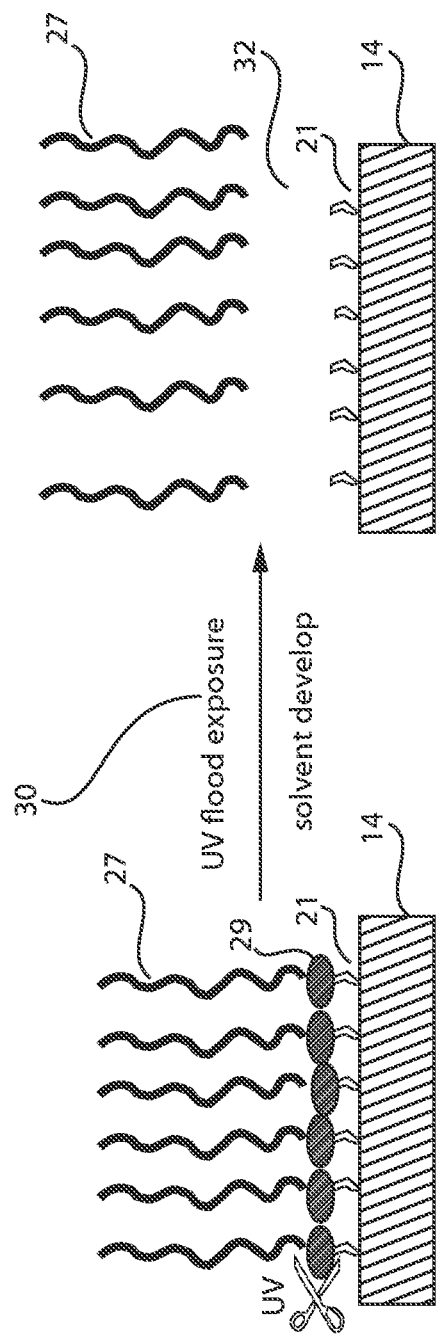
FIG. 3 is a polymer brush with an ultraviolet (UV) cleavable moiety in the polymer chain or self-assembled monolayer (SAM) close to the binding group, in accordance with an embodiment of the present invention.

FIG. 3 is a polymer brush with an ultraviolet (UV) cleavable moiety in the polymer chain or self-assembled monolayer (SAM) close to the binding group, in accordance with an embodiment of the present invention.

For UV light cleaving or breaking, photo-cleavable (PC) modifications include a photolabile functional group that is cleavable by UV light of specific wavelength (e.g., 300-350 nm). The UV light cleaving or flood exposure 30 results in removal of the UV cleavable group 29. The grafting group 21 is installed close to the binding group or directly adjacent the hardmask 14. The removal of the UV cleavable group 29 for grafting results in gap 32 formed between the polymers 27 and the grafting group 21. In particular, the UV breaks the molecular bond and after UV exposure there will be molecular level residual of grafting group 21 left on the surface.

Figure 4:
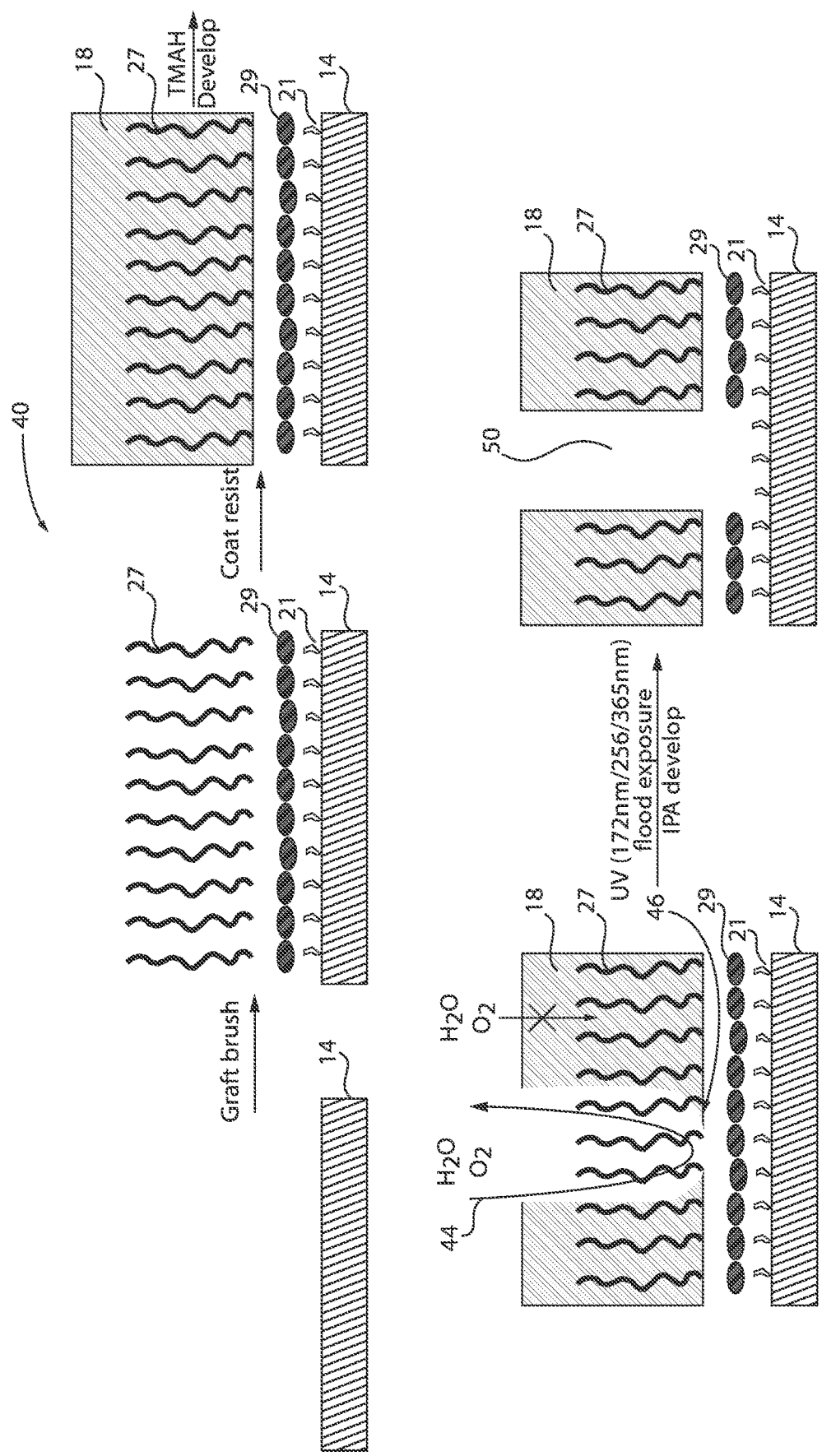
FIG. 4 is a process for forming the polymer brush with the UV cleavable moiety in the polymer chain or SAM close to the binding group, in accordance with an embodiment of the present invention.

FIG. 4 is a process 40 for forming the polymer brush with the UV cleavable moiety in the polymer chain or SAM close to the binding group, in accordance with an embodiment of the present invention.

A polymer brush or SAM material 25 with grafting unit 21 binds to bottom hard mask 14 as an adhesion layer during EUV exposure 44. Post litho flood exposure develops major brush polymer at EUV exposed regime or area 50, thus reducing scumming 46 and enabling fast pattern transfer. In one example embodiment, the solvent developer can be an Iso-propyl Alcohol (IPA). The polymer brush 25 act as an adhesion promoter during EUV exposure 44.

Stated differently, a UV sensitive polymer brush or SAM can be synthesized with a UV cleavable moiety near the binding group. The polymer brush or SAM can be coated onto the hardmask and binds. The photoresist can be coated on top of the polymer brush or SAM. The resist can be exposed to EUV (13.5 nm) and developed in, e.g., tetramethylammonium hydroxide (TMAH). Following EUV exposure and development, there can be a UV flood exposure (e.g., 172 nm/256 nm/365 nm) to cleave or break the polymer brush or SAM close to the binding group. There can also be a second development in IPA to remove the brush and associated scum or residue.

Figure 5:
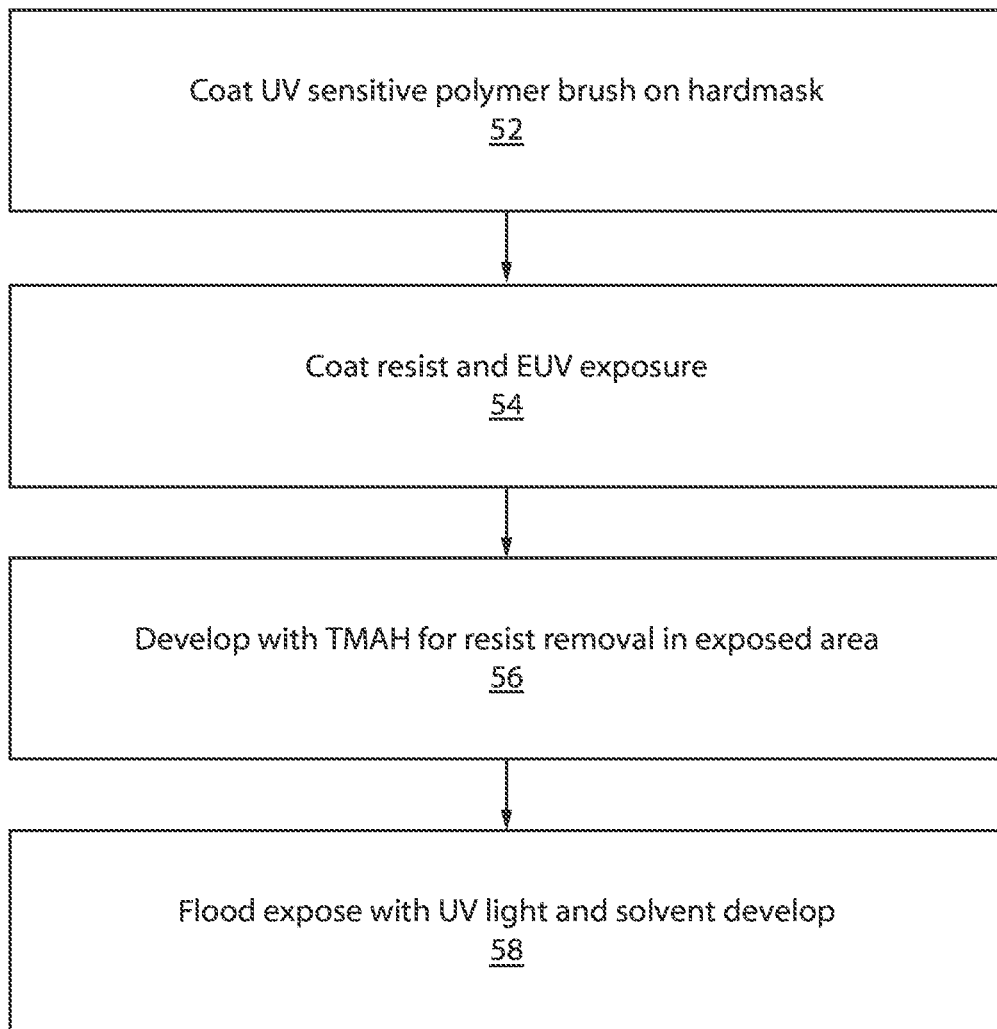
FIG. 5 is a method for forming the polymer brush with the UV cleavable moiety in the polymer chain or SAM close to the binding group, in accordance with an embodiment of the present invention.

FIG. 5 is a method for forming the polymer brush with the UV cleavable moiety in the polymer chain or SAM close to the binding group, in accordance with an embodiment of the present invention.

At block 52, coat UV sensitive polymer brush on hardmask.

At block 54, coat resist and perform EUV exposure.

At block 56, develop with tetramethylammonium hydroxide (TMAH) for resist removal in the exposed area.

At block 58, flood expose with UV light and solvent develop.

Figure 6:
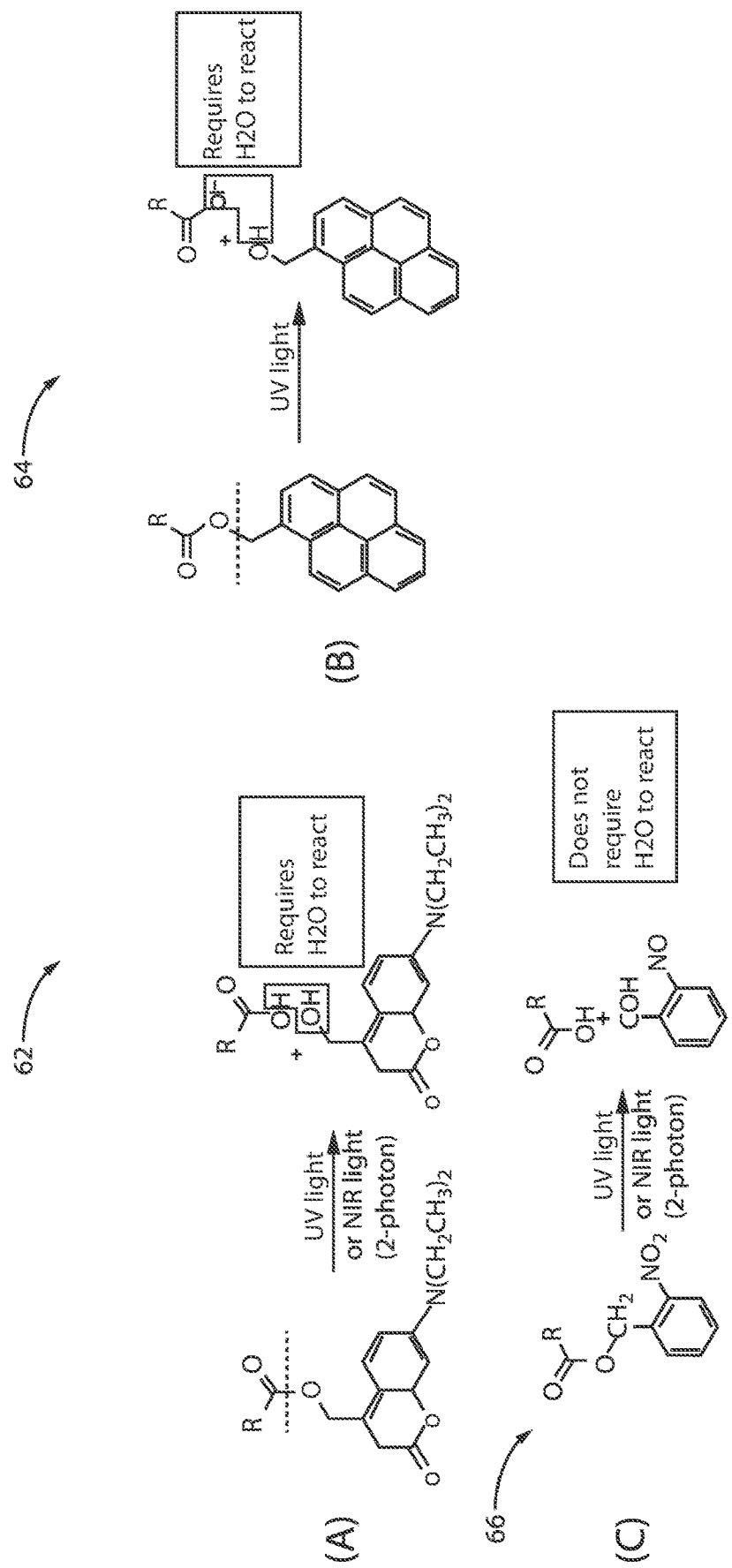
FIG. 6 illustrates exemplary UV cleavable moieties, in accordance with an embodiment of the present invention.

FIG. 6 illustrates exemplary UV cleavable moieties, in accordance with an embodiment of the present invention.

The first exemplary UV cleavable moiety 62 is:

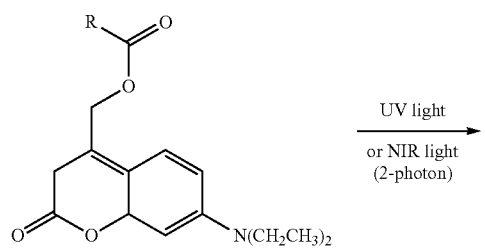

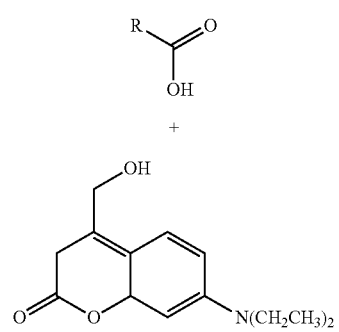

The first exemplary UV cleavable moiety needs water (H$_2$O) to react.

The second exemplary UV cleavable moiety 64 is:

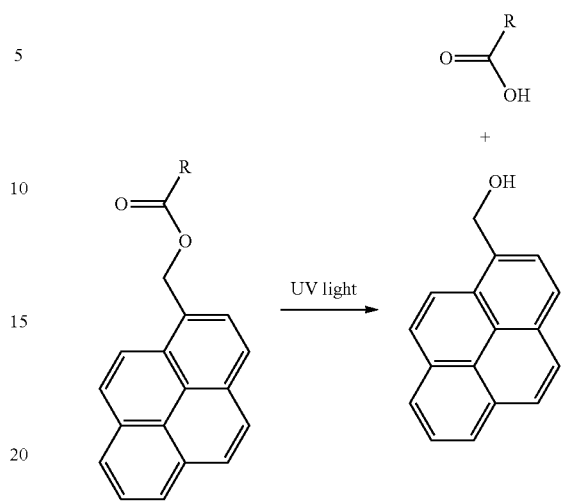

The second exemplary UV cleavable moiety needs water (H$_2$O) to react.

The third exemplary UV cleavable moiety 66 is:

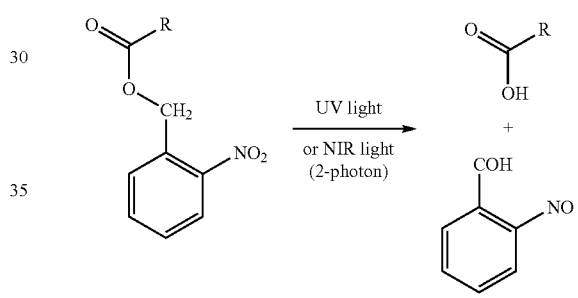

The third exemplary UV cleavable moiety does not need water (H$_2$O) to react.

Cleavable linkers can be classified into two classes. The first class needs a reactive species e.g., a reductive species or OH− or H+ in order to achieve breakage. Examples are disulfide bridges which could be cleaved by reduction with thiols or baselabile "linkers" like an RNA monomer incorporated at the terminus of an oligonucleotide. The second class is cleaved by physical means e.g., by irradiation such as illumination or heating.

Photo-cleavable linkers are linkers where a covalent bond is broken by means of irradiation with light. The irradiation wavelength has to be chosen in such a manner that the nucleobases of the attached oligonucleotides do not absorb in order to avoid side reactions like T-T dimerization or photo-oxidation. If organic dyes are attached to the bead, e.g., within a detection probe, the irradiation wavelength does not match absorption of such dyes.

Usually, photo-cleavable linkers are, for example, derived from orthonitrobenzylalkohols. The photo-breakage can be achieved by irradiation with UV light of a wavelength, e.g., greater than 340 nm.

In summary, today's lithography process is called 193-nm immersion lithography. As the name implies, light with a wavelength of 193 nm shines through a patterned surface called a photomask. That process casts the pattern through water onto the silicon wafer, where it is fixed by a photosensitive chemical and then etched onto the wafer. The problem is that light can't directly define features smaller than its own wavelength. And 193 nm is so much longer than the size of the features modern chips need. These days it takes a host of optical tricks and work-arounds to make up the difference. The most costly of these is the use of as many as three or four different photomasks to produce a single pattern on a chip. With today's most complex processors, that means a wafer could need some 80 trips though the lithography tool.

EUV lithography's reason for being is that it uses 13.5-nm light, which is much closer to the size of the final features to be printed. With it, manufacturers can turn three or four lithography steps into one. For the 7-nm EUV process, several steps, e.g., 15 steps, can be replaced with fewer steps, such as, e.g., 5 steps. The exemplary embodiments of the present invention improve EUV quad stacks by providing for a novel adhesion layer. The adhesion layer includes the installation of a UV cleavable moiety in the polymer chain or SAM close to the binding group. Thus, the polymer brush or SAM can act as an adhesion promoter during EUV exposure. This provides another step closer to successfully implementing the 7-nm EUV process.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys. Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a method and device for making an adhesion layer of an extreme ultraviolet (EUV) quad stack, the adhesion layer employing a UV cleavable moiety (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method of making an adhesion layer of an extreme ultraviolet (EUV) stack, the method comprising:
grafting an ultraviolet (UV) sensitive polymer brush on a hardmask, the polymer brush including a UV cleavable linker;
depositing EUV resist over the polymer brush;
exposing the EUV resist to remove the EUV resist in exposed areas by applying a first developer; and
flooding the exposed area with a UV light and a second developer to remove exposed portions of the polymer brush and the respective UV cleavable linker.

2. The method of claim 1, wherein the UV cleavable linker is positioned at a surface binding site adjacent the hardmask.

3. The method of claim 1, wherein the flooding of the exposed area breaks a bond between the polymer brush and the hardmask.

4. The method of claim 1, wherein breaking of the bond frees major polymer chain molecules resulting in a thin layer formed over the hardmask.

5. The method of claim 1, wherein the first developer is tetramethylammonium hydroxide (TMAH).

6. The method of claim 1, wherein the second developer reduces scumming without sacrificing adhesion capability.

7. The method of claim 1, wherein the second developer is Iso-propyl Alcohol (IPA).

8. A method of making an adhesion layer of an extreme ultraviolet (EUV) stack, the method comprising:
grafting a self-assembled monolayer (SAM) on a hardmask, the SAM including an ultraviolet (UV) cleavable linker;
depositing EUV resist over the SAM;
exposing the EUV resist to remove the EUV resist in exposed areas by applying a first developer; and
flooding the exposed area with a UV light and a second developer to remove exposed portions of the SAM and the respective UV cleavable linker.

9. The method of claim 8, wherein the UV cleavable linker is positioned at a surface binding site adjacent the hardmask.

10. The method of claim 8, wherein the flooding of the exposed area breaks a bond between the polymer brush and the hardmask.

11. The method of claim 8, wherein breaking of the bond frees major polymer chain molecules resulting in a thin layer formed over the hardmask.

12. The method of claim 8, wherein the first developer is tetramethylammonium hydroxide (TMAH).

13. The method of claim 8, wherein the second developer reduces scumming without sacrificing adhesion capability.

14. The method of claim 8, wherein the second developer is Iso-propyl Alcohol (IPA).

* * * * *